(12) United States Patent  (10) Patent No.: US 6,697,284 B2
Marotta  (45) Date of Patent: Feb. 24, 2004

(54) FLASH MEMORY ARRAY STRUCTURE

(75) Inventor: Giulio Giuseppe Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/231,449

(22) Filed: Aug. 29, 2002

(65) Prior Publication Data

US 2003/0058689 A1 Mar. 27, 2003

(30) Foreign Application Priority Data

Aug. 30, 2001 (IT) ..................... RM2001A0524

(51) Int. Cl.[7] .............................................. G11C 16/04
(52) U.S. Cl. ....................... 365/189.03; 365/51; 365/63
(58) Field of Search .............................. 365/189.03, 63, 365/51

(56) References Cited

U.S. PATENT DOCUMENTS

| | | | |
|---|---|---|---|
| 5,384,745 A | 1/1995 | Konishi et al. | |
| 5,511,029 A | 4/1996 | Sawada et al. | |
| 5,587,950 A | 12/1996 | Sawada et al. | |
| 5,956,285 A | * 9/1999 | Watanabe et al. | 365/230.03 |
| 6,198,667 B1 | * 3/2001 | Joo | 365/189.04 |
| 6,463,004 B2 | * 10/2002 | Guliani et al. | 365/230.03 |

* cited by examiner

*Primary Examiner*—Richard Elms
*Assistant Examiner*—Pho M. Luu
(74) *Attorney, Agent, or Firm*—Leffert Jay & Polglaze, P.A.

(57) ABSTRACT

A flash memory array structure that has independently operating memory arrays. In one embodiment, a flash memory device comprises a poly silicon layer, a first metal layer and a second metal layer. The poly silicon layer has a plurality of word lines formed therein. The word lines are coupled to rows of memory cells. The first metal layer has a plurality of local bit lines formed therein. The local bit lines are coupled to columns of memory cells. The second metal layer has a plurality of global bit lines formed therein. The global bit lines are selectively coupled to the plurality of local bit lines. The global bit lines are further selectively bisected during manufacture to form a first bank and a second bank of memory cells. The first and second banks allow concurrent memory operations to be performed on the flash memory device.

43 Claims, 5 Drawing Sheets

FLASH MEMORY ARRAY STRUCTURE

RELATED APPLICATIONS

This application claims priority to Italian Patent Application Serial No. RM2001A000524, filed Aug. 30, 2001, entitled "FLASH MEMORY ARRAY STRUCTURE."

TECHNICAL FIELD OF THE INVENTION

The present invention relates generally to non-volatile memory devices and in particular the present invention relates to a flash memory array structure having independently operating memory arrays.

BACKGROUND OF THE INVENTION

A flash memory is a type of non-volatile memory. That is, a flash memory is a type of memory that retains stored data without a periodic refresh of electricity. An important feature of a flash memory is that it can be erased in blocks instead of one byte at a time. Each erasable block of memory comprises a plurality of non-volatile memory cells (cells) arranged in rows and columns. Each cell is coupled to a word line, bit line and source line. In particular, a word line is coupled to a control gate of each cell in a row, a bit line is coupled to a drain of each cell in a column and the source line is coupled to a source of each cell in an erasable block. The cells are programmed and erased by manipulating the voltages on the word lines, bit lines and source lines.

Recently, flash memory devices have been designed with two independent banks of memory cells. This design allows for concurrent memory operations such as read-while write or read-while-erase. For example, while one processor writes to one location of a bank, a second processor can read a memory location in another bank. This design has particular application in cellular phone systems. In a cellular phone application, a first bank can be used to store a code for operation of the phone and the second bank can be used to store data. In a typical cellular phone application, a first bank takes approximately 75% of the total memory and the second bank takes approximately 25% of the total memory. However, for different cellular phones and different applications different partition percentages may be desired. To achieve desired partition percentages, a manufacture must design separate devices for each application. An efficient way to design and manufacture a device that can fulfill a large number of applications is needed.

For the reasons stated above, and for other reasons stated below which will become apparent to those skilled in the art upon reading and understanding the present specification, there is a need in the art for a flash memory design that allows for an easy and efficient way to provide partition percentages of memory banks.

SUMMARY OF THE INVENTION

The above-mentioned problems with memory devices and other problems are addressed by the present invention and will be understood by reading and studying the following specification.

In one embodiment, a flash memory device is disclosed. The flash memory device comprises a poly silicon layer, a first metal layer and a second metal layer. The poly silicon layer has a plurality of word lines formed therein. The word lines are coupled to rows of memory cells. The first metal layer has a plurality of local bit lines formed therein. The local bit lines are coupled to columns of memory cells. The second metal layer has a plurality of global bit lines formed therein. The global bit lines are selectively coupled to the plurality of local bit lines. The global bit lines are further selectively bisected during manufacture to form a first bank and a second bank of memory cells. The first and second banks allow concurrent memory operations to be performed on the flash memory device.

In another embodiment, a non-volatile memory device comprises a first and second bank, word lines, local bit lines and global bit lines. Each bank has a pair of quadrants of non-volatile memory cells. The memory cells in each quadrant are arranged in row and column fashion. There is a word line for each row of memory cells in each quadrant. Each word line is formed in a poly silicon layer. There is a local bit line for each column in each quadrant. Each local bit line is formed in a first metal layer. A plurality of the global bit lines are selectively coupled to the local bit lines in each quadrant. The global bit lines are formed in a second metal layer. Moreover, the global bit lines are disconnected at selected locations to form the first and second bank.

In another embodiment, a flash memory device comprises a memory array, word lines, local bit lines and global bit lines. The memory array has memory cells arranged in rows and columns. There is a word line for each row of memory cells in the memory array. Each word line is formed in a poly silicon layer. There is a local bit line for each row of memory cells in the memory array. Each local bit line is formed in a first metal layer. A plurality of the global bit lines are selectively coupled to the local bit lines. Each global bit line is formed in a second metal layer. The global bit lines are selectively bisected to form a first and second bank of memory cells in the memory array to allow concurrent memory operations.

A method of forming a flash memory device having a pair of independently operating memory arrays comprising, bisecting global bit lines at predetermined locations during manufacture of the flash memory device to form independently operating memory arrays.

A method of forming a flash memory device comprising, forming word lines in a poly silicon layer, forming local bit lines in a first metal layer, forming global bit lines in a second metal layer, wherein the first metal layer is positioned between the poly silicon layer and the second metal layer and masking the second metal layer while the global bit lines are being formed to break the global bit lines at desired locations, wherein a first and second bank of memory cells in the flash memory device is formed.

Another method of forming a flash memory device comprising, forming word lines in a poly silicon layer, wherein the word lines are coupled to gates of memory cells arranged in columns in a memory array, forming local bit lines in a first metal layer, wherein the local bit lines are coupled to drains of memory cells arranged in rows in the memory array, forming global bit lines in a second metal layer, wherein the global bit lines are selectively coupled to the local bit lines and bisecting the global bit lines at predetermined locations to form a first and second bank in the memory array, wherein concurrent memory operations can be performed on the first and second banks.

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and the equivalents thereof.

Figure 1:
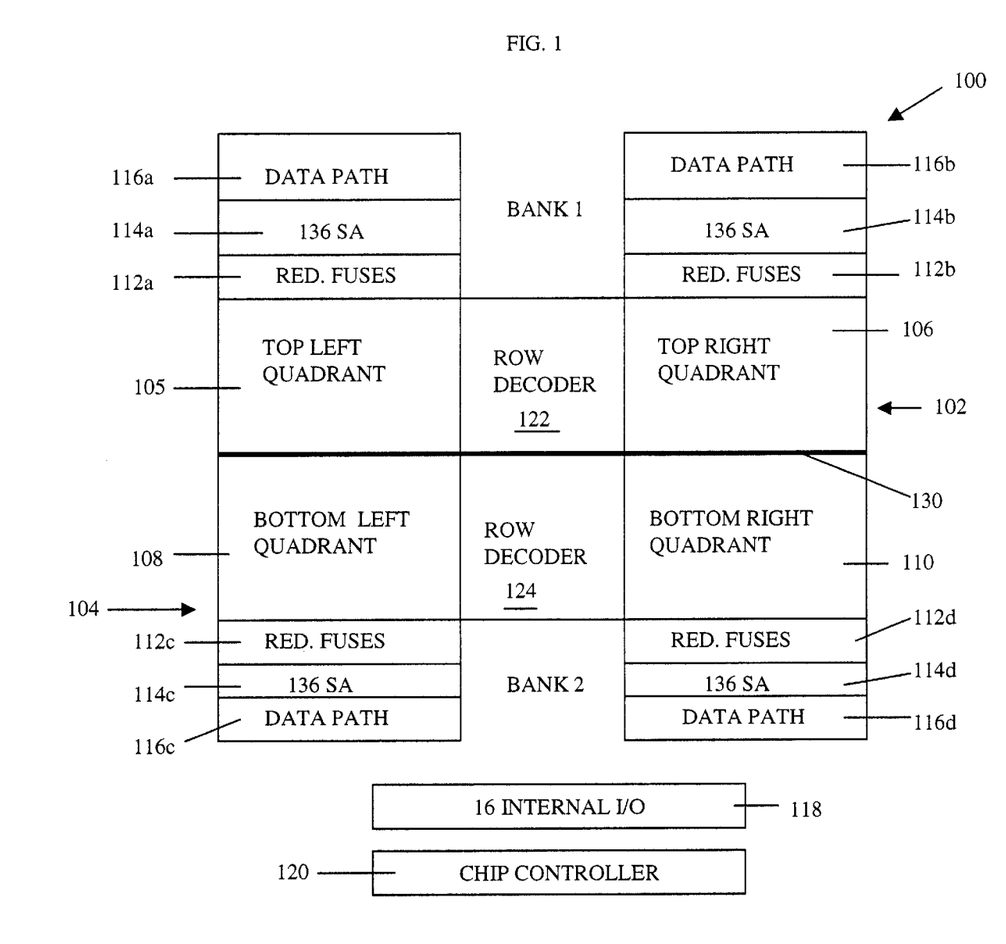
FIG. 1 is a block diagram of one embodiment of the present invention.

In the present invention, a novel architecture for a flash memory is disclosed that allows the efficient portioning of a memory array. Referring to FIG. 1, one embodiment of a flash memory 100 of the present invention is shown. As shown, the memory 100 has a first bank 102 and a second bank 104. Although, the first bank 102 and the second bank 104 reside in the same integrated circuit chip, the first bank 102 is physically disconnected from the second bank 104. The duel banks 102 and 104 allow concurrent operations to take place in the memory 100. For example, the first bank 102 can be performing a write operation and the second bank 104 can be performing a read operation.

Each bank 120 and 104 is divided into quadrants that make up a primary array. Specifically, the first bank 102 is divided into a top left quadrant 105 and a top right quadrant 106. The second bank 104 is divided into a bottom left quadrant 108 and a bottom right quadrant 110. The top left quadrant 105 and the top right quadrant 106 of the first bank 102 are separated by a first row decoder 122 (row decoder circuit 122). The first row decoder 122 is used to decode row address requests within the first bank 102. The bottom left quadrant 108 and the bottom right quadrant 110 of the second bank 104 are separated by a second row decoder 124 (second row decoder circuit 124). The second row decoder 124 is used to decode row address requests within the second bank 104. The terms "top," "bottom," "left" and "right" are used merely to define the four separate quadrants 105, 106, 108 and 110. That is, the terms are merely used to aid the reader in understanding location of each quadrant with respect to the other quadrants regardless of the orientation of an integrated circuit incorporating a flash memory of the present invention.

Each bank 102 and 104 has its own redundancy fuse circuit and sense amplifiers. The redundancy fuse circuits comprise redundancy fuses (non-volatile cells). In particular, the top left quadrant 105 of the first bank 102 is coupled to redundancy fuse circuit 112a and the top right quadrant 106 of the first bank 102 is coupled to redundancy fuse circuit 112b. Moreover, the bottom left quadrant 108 of the second bank 104 is coupled to redundancy fuse circuit 112c and the bottom right quadrant 110 of the second bank 104 is coupled to redundancy fuse circuit 112d. The redundancy fuses in the redundancy fuse circuits 112(a–d) make up a secondary array to store operating parameters such as configuration bits, engineering bits, one time programmable (OTP) bits and trimming bits. Also included in the redundancy fuse circuits 120(a–d) are column and row redundancy fuses and latches used to selectively replace defective rows and columns with redundant rows and columns.

Each bank 102 and 104 has a sense amplifier circuit comprising sense amplifiers. In particular, the top left quadrant 105 of the first bank 102 is coupled to sense amplifier circuit 114a and the top right quadrant 106 of the first bank 102 is coupled to sense amplifier circuit 114b. Moreover, the bottom left quadrant 108 of the second bank 104 is coupled to sense amplifier circuit 114c and the bottom right quadrant 110 of the second bank 104 is coupled to sense amplifier circuit 114d. The sense amplifiers in the sense amplifier circuits 114(a–d) are respectfully coupled to read the redundant fuses 112(a–d) and cells in respective quadrants 105, 106, 108 and 110. By having separate sense amplifiers circuits 114(a–d) for each quadrant 105, 106, 108 and 110, separate operations can be performed on the first bank 102 and the second bank 104.

Moreover, each bank 102 and 104 also has data path circuitry used to transfer data to and from the cells in the quadrants 105, 106, 108 and 110. In particular, the top left quadrant 105 of the first bank 102 is coupled to data path circuitry 116a and the top right quadrant 106 of the first bank 102 is couple to data path circuitry 116b. Moreover, the bottom left quadrant 108 of the second bank 104 is coupled to data path circuitry 116c and the bottom right quadrant 110 of the second bank 104 is coupled to data path circuitry 116d. The data path circuitry 116(a–d) is used to route data (bits) to and from the primary and secondary array.

Each data path circuitry 116(a–d) is coupled to internal input/output (I/O) lines 118. The flash memory array 100 of FIG. 1 is illustrated as having 16 I/O lines 118. In this example, 16 bits are read from or written to the memory banks 102 and 104. It will, however, be recognized in the art that memory designs having more or less I/O lines could be used without departing from the spirit of the present invention and the present invention is not limited to 16. FIG. 1 also illustrates a chip controller circuit 120. The chip control circuit 120 is used to control memory operations to memory cells in the primary and secondary arrays in the first and second banks 102 and 104. The chip controller circuit 120 can be referred to as control circuitry 120.

Figure 2:
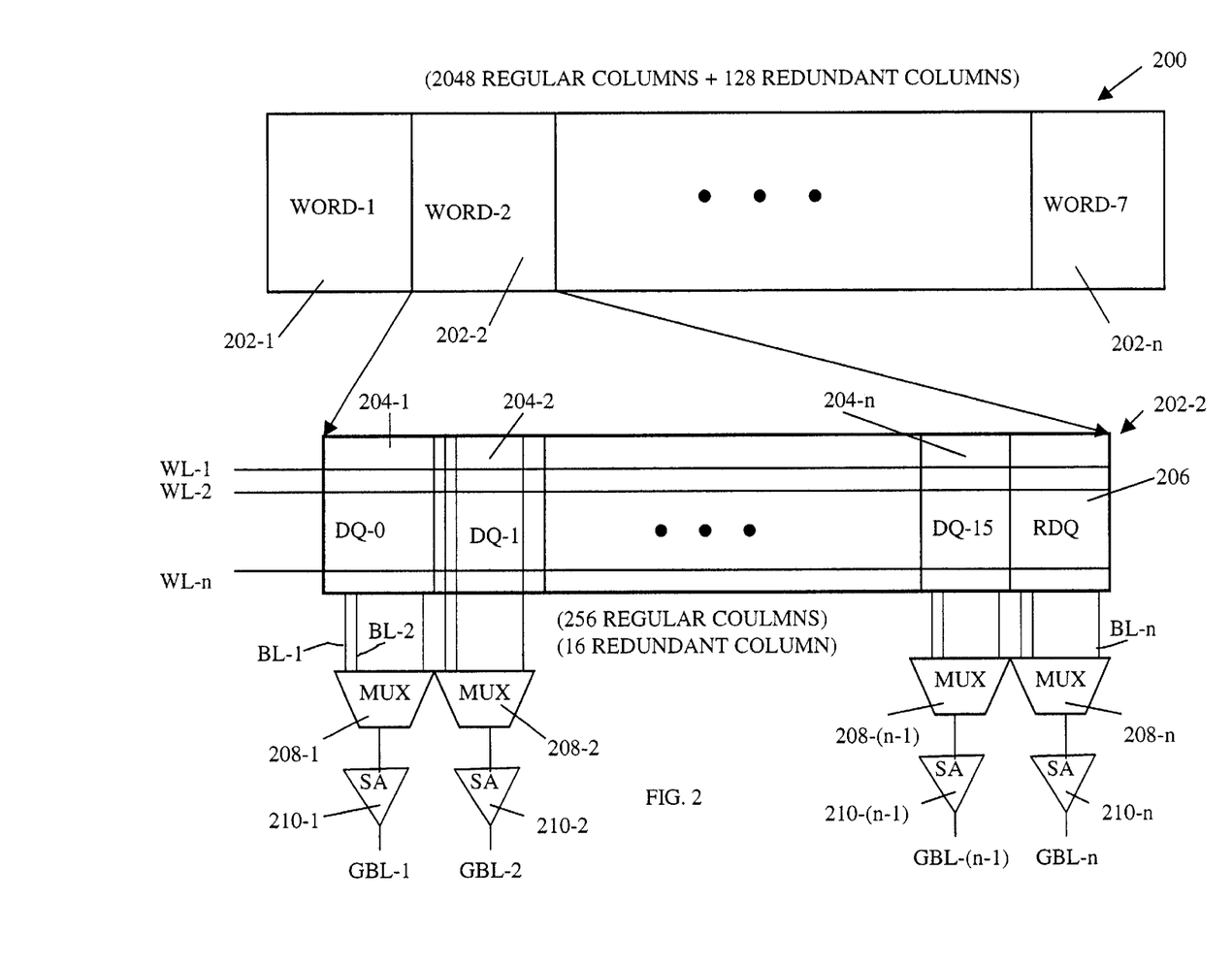
FIG. 2 is a block diagram illustrating a sector of the present invention.

Each of quadrant 105, 106, 108 and 110 is partitioned into individually erasable sectors 200 or blocks 200. The erasable sectors 200 are stacked one after another in their associated quadrant 105, 106, 108 and 110. Referring to FIG. 2, the contents of a sector 200 of one embodiment of the present invention is illustrated. In this embodiment, sector 200 is illustrated as having 2048 regular columns and 128 redundant columns. As shown, sector 200 is made up of a group of words 202(1-n). Moreover, in this embodiment there are 8 groups of words 202(1-n). In addition, in this embodiment, each word 202(1-n) has 256 regular columns and 16 redundant columns. In this embodiment, the columns or bit lines in each word 202(1-n) are further grouped into 17 groups of 16 DQs groups 204(1-n) containing the regular columns and 1 RDQ group 206 containing the redundant columns. Each DQ group 204(1-n) contains 16 columns and each RDQ group 206 contains 16 redundant columns. Local bit lines BL(1-n) are respectfully coupled to drains of cells in columns in each DQ group 204(1-n) and each RDQ group 206. Moreover, as shown, word lines WL(1-n) transverse each word 202(1-n) and are coupled to control gates of memory cells arranged in rows in the words 202(1-n).

Figure 3:
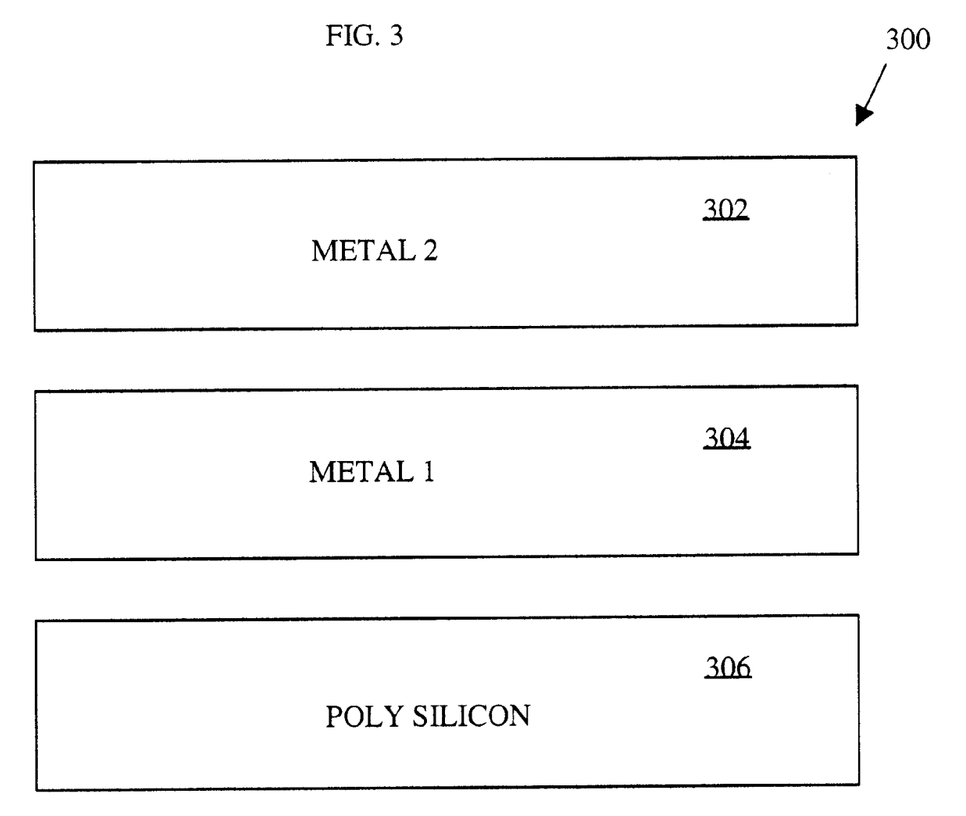
FIG. 3 is a block diagram illustrating the layers of material used to make one embodiment of the present invention.

Although, sector 200 of FIG. 3 is described as having 2048 regular columns and 128 redundant columns, it will be understood in the art that the number of columns and the number of redundant columns in each sector and word could vary, and the present invention is not limited to sectors having 2048 regular columns and 128 redundant columns. Likewise, it will also be understood in the art that the number of regular columns and redundant columns in each word 202(1-n) could very without departing from the sprit of the present invention.

As also shown in FIG. 2, a plurality of multiplexer circuits 208(1-n) are coupled to the bit lines of associated words 204(1-n). Each multiplexer is used to selectively couple a selected bit line to an associated sense amplifier 210(1-n) in an associated sense amplifier circuit 114(a–d) of FIG. 1. Referring back to FIG. 2, each sense amplifier 210(1-n) has an output coupled to an associated global bit line GBL(1-n) in an associated data path circuit 116 of FIG. 1. The global bit lines GBL(1-n) are coupled the internal I/O lines 118.

Referring to FIG. 3, a physical layout 300 of the materials of the integrated circuit used to make one embodiment of the present invention is shown. In particular, FIG. 3 illustrates the physical positioning of material layers in relation to each other. The word lines WL(1-n) are poly silicon lines formed in the poly silicon layer 306. The local bit lines BL(1-n) are formed in a first metal layer 304. The global bit lines are formed in a second metal layer 302. In the present invention, the second metal layer 302 is the last metal layer to be formed. In addition, the external I/O lines 126 are also formed in the second metal layer. The first and second metal layers 304 and 302 are made of conducting metals including, but not limited to, copper, aluminum, gold and silver.

The positioning of the word lines WL(1-n), bit lines BL(1-n) and the global bit lines GBL(1-n) as described above allow for easy partitioning of the first and second banks 102 and 104. In particular, the first bank 102 is partitioned from the second bank 104 by bisecting (disconnecting or breaking) the global lines GLB(1-n) in the second metal layer 302 at a desired location. Since, the second metal layer 302 contains the global bit lines GBL(1-n) and the second metal layer 302 is the last layer of metal formed on the integrated circuit containing the memory 100, only the last stages of the manufacturing process have to be altered to vary the partitioning percentages. Therefore, the production flow does not have to be disturbed by having to create totally different chips to achieve different partition requirements. That is, in the present invention, only the last metal layer has to be masked when being formed to created a desired partition.

Although, the present invention has been described as being formed with two metal levels, the first and second metal layers 304 and 302, it will be understood in the art that more metal layers could be used with the memory architecture described in the present invention as long as the global bit lines are formed in the last metal layer. Accordingly, the present invention is not limited to two metal layers.

The chip controller circuit 120 is internally programmed during manufacture via straps coupled in the metal layer containing the global bit lines GBL(1-n) to set boundary addresses. Thereafter, the chip controller circuit 120 uses the boundary addresses set by the straps to perform specific memory operations on the first and second banks 102 and 104.

The only restriction on the placement of the partition is that the global lines GLB(1-n) have to be disconnected between sectors 200 of the stack of sectors 200 in an associated quadrant 105, 106, 108 or 110. That is, the global bit lines GLB(1-n) need to be disconnected so that every cell in an erasable sector 200 is partitioned into only one quadrant 105, 106, 108 or 110. Accordingly, the partitions may be selectively placed to achieve desired memory sizes of the first and second banks 102 and 104 with a partition granularity of 1 sector. For example if each sector 200 contains 0.5 Mbits of memory cells, the granularity will be 0.5 Mbits.

Figure 4:
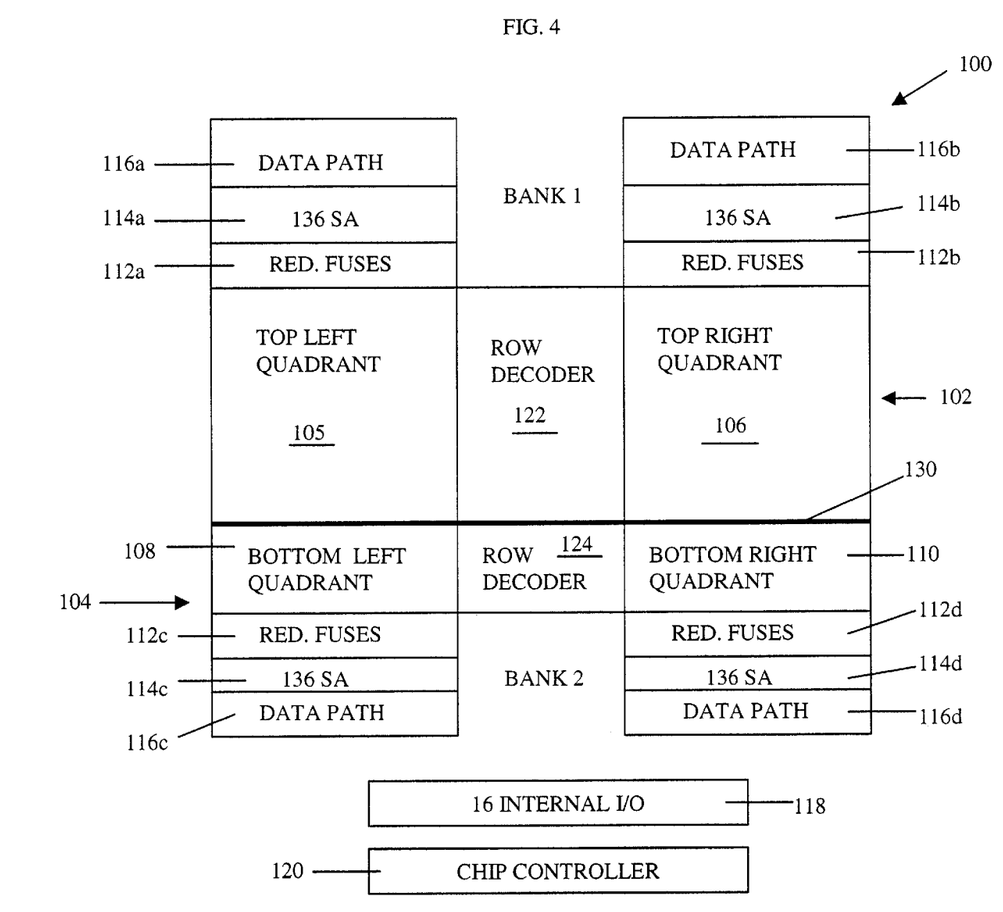
FIG. 4 is a block diagram of one embodiment of the present invention illustrating the first bank having a different size than the second bank.
Figure 5:
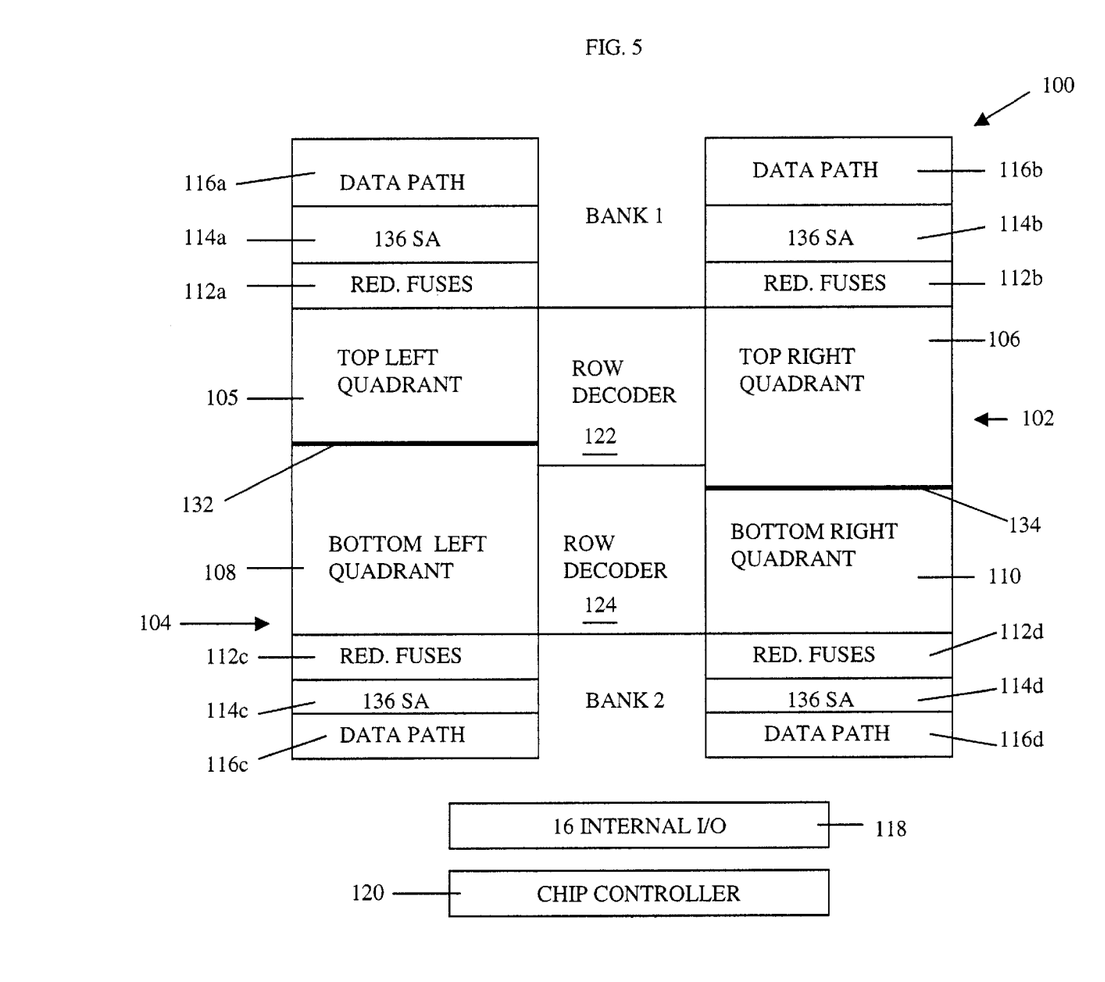
FIG. 5 is a block diagram of one embodiment of the present invention, illustrating sectors of different sizes.

Referring back to FIG. 1, the partition of the first and second banks 102 and 104 is illustrated by partition line 130. The partition line 130 is place in FIG. 1 to represent a partition of approximately 50%. That is, the first bank 102 has 50% of the memory space and the second bank also has 50% of the memory space. FIG. 4 represents a partition of approximately 75% and 25%. In particular, in this example, the first bank 102 has 75% of the memory space and the second bank 104 has 25% of the memory space as reflected by the partition line 130. In addition, the top and bottom left quadrants 105 and 108 can have a different partition percentage than the top and bottom right quadrants 106 and 110. An example of this is illustrated in FIG. 5. As illustrated, the top and bottom left quadrants 105 and 108 are partitioned at left partition line 132 and the top and bottom right quadrants 106 and 110 are partitioned at right partition line 134.

CONCLUSION

In one embodiment, a flash memory device is disclosed that comprises a poly silicon layer, a first metal layer and a second metal layer. The poly silicon layer has a plurality of word lines formed therein. The word lines are coupled to rows of memory cells. The first metal layer has a plurality of local bit lines formed therein. The local bit lines are coupled to columns of memory cells. The second metal layer has a plurality of global bit lines formed therein. The global bit lines are selectively coupled to the plurality of local bit lines. The global bit lines are further selectively bisected during manufacture to form a first bank and a second bank of memory cells. The first and second banks allow concurrent memory operations to be performed on the flash memory device.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A flash memory device comprising:
   a poly silicon layer having a plurality of word lines formed therein, the word lines are coupled to rows of memory cells;
   a first metal layer having a plurality of local bit lines formed therein, the local bit lines are coupled to columns of memory cells; and
   a second metal layer having a plurality of global bit lines formed therein, the global bit lines are selectively coupled to the plurality of local bit lines, the global bit lines are further selectively bisected during manufacture to form a first bank and a second bank of memory cells, wherein concurrent memory operations can be performed on the first and second banks.

2. The flash memory device of claim 1 further comprising:
   control circuitry to control memory operations to the memory cells, wherein the control circuitry is programmed during manufacture to recognize boundary addresses of the memory cells in the respective first and second banks.

3. The flash memory device of claim 1 wherein the second metal layer containing the global bit lines is the last metal layer to be formed so the size of the first and second banks are created toward the end of the production process of the flash memory device to minimize disruptions.

4. The flash memory device of claim 1 wherein each bank has a pair of quadrants of memory cells separated by a row decoder circuit, wherein each row decoder circuit is used to decode row address requests to the rows of memory cells in its pair of associated quadrants.

5. The flash memory device of claim 4 wherein each quadrant has a stack of erasable sectors of memory cells.

6. The flash memory device of claim 5 wherein the global bit lines are bisected to partition the first and second banks between erasable sectors of memory cells.

7. The flash memory device of claim 4 wherein the number of sectors of memory cells in each quadrant are determined by the location of the bisection of the global bit lines.

8. A non-volatile memory device comprising:
   a first and second bank, each bank having a pair of quadrants of non-volatile memory cells, the memory cells in each quadrant are arranged in row and column fashion;
   a word line for each row of memory cells in each quadrant, each word line is formed in a poly silicon layer;
   a local bit line for each column in each quadrant, each local bit line is formed in a first metal layer; and
   a plurality of global bit lines selectively coupled to the local bit lines in each quadrant, the global bit lines are formed in a second metal layer, wherein the global bit lines are disconnected at selected locations to form the first and second bank.

9. The non-volatile memory device of claim 8 wherein concurrent memory operations can occur in the first and second banks.

10. The non-volatile memory device of claim 8 wherein the memory space in each quadrant is determined by the position of the disconnection in the global bit lines.

11. The non-volatile memory device of claim 8 wherein the second metal layer is the last metal layer to be formed in manufacturing the non-volatile device.

12. The non-volatile memory device of claim 8 further comprising:
   a chip controller circuit to control memory operations to the memory cells, the chip controller circuit is programmed to set boundary addresses defining the first bank and the second bank.

13. The non-volatile memory device of claim 8 wherein each word line is coupled to a control gate of each memory cell in an associated row of memory cells.

14. The non-volatile memory device of claim 8 wherein each local bit line is coupled to a drain of each memory cell in associated column of memory cells.

15. The non-volatile memory device of claim 8 wherein each quadrant has a sense amplifier circuit and data path circuit.

16. A flash memory device comprising:
   a memory array having memory cells arranged in rows and columns;
   a word line for each row of memory cells in the memory array, each word line is formed in a poly silicon layer;
   a local bit line for each row of memory cells in the memory array, each local bit line is formed in a first metal layer; and
   a plurality of global bit lines selectively coupled to the local bit lines, each global bit line is formed in a second metal layer, wherein the global bit lines are selectively bisected to form a first and second bank of memory cells in the memory array to allow concurrent memory operations.

17. The flash memory device of claim 16 further comprising:
   control circuitry to control memory operations to the first and second banks, wherein boundary addresses that distinguish the memory cells in an associated bank are programmed in the control circuitry.

18. The flash memory device of claim 17 wherein the boundary addresses programmed in the control circuitry are set via straps coupled to the second metal layer.

19. The flash memory device of claim 16 wherein each bank is divided into a pair of quadrants.

20. The flash memory device of claim 19 further comprising:
   a first row decoder circuit coupled between the pair of quadrants in the first bank to route row address requests to the memory cells in the pair of quadrants in the first bank; and
   a second row decoder circuit coupled between the pair of quadrants in the second bank to route row address requests to the memory cells in the pair of quadrants in the second bank.

21. The flash memory of claim 19 wherein each quadrant further comprises:
   a plurality of individually erasable blocks of memory cells.

22. The flash memory of claim 21 wherein each block is arranged in groups of words, further wherein each word contains a plurality of regular columns of memory cells and a plurality of redundant columns of memory cells.

23. The flash memory of claim 22 wherein the regular columns in each word are further separated into DQ groups and the redundant columns in each word are separated into a RDQ group.

24. The flash memory device of claim 23 wherein each DQ group and each RDQ group of word lines are selectively coupled to an associated sense amplifier in the sense amplifier circuits by a multiplexer.

25. The flash memory device of claim 23 further comprising:
   a data path circuit for each quadrant to transfer data to and from the memory cells in the quadrant.

26. The flash memory device of claim 25 further comprising:
   a plurality of internal input/output lines coupled to the data path circuitry to transfer data to and from the memory cells, wherein the input/output lines are formed in the second metal layer.

27. A method of forming a flash memory device having a pair of independently operating memory arrays comprising:
   bisecting global bit lines at predetermined locations during manufacture of the flash memory device to form independently operating memory arrays.

28. The method of claim 27 wherein each of the memory arrays has its own set of sense amplifiers to read memory cells and data path circuits to transfer data to and from selected memory arrays.

29. The method of claim 27 wherein the global bit lines are formed in a last metal layer of the flash memory device.

30. The method of claim 29 wherein disconnecting the global bit lines further comprises:

masking the last metal layer during formation of the global bit lines to bisect the global bit lines.

31. The method of claim 29 wherein the last metal layer is the last metal layer formed in making the flash memory device.

32. A method of forming a flash memory device comprising:

forming word lines in a poly silicon layer;

forming local bit lines in a first metal layer;

forming global bit lines in a second metal layer, wherein the first metal layer is positioned between the poly silicon layer and the second metal layer; and masking the second metal layer while the global bit lines are being formed to break the global bit lines at desired locations, wherein a first and second bank of memory cells in the flash memory device is formed.

33. The method of claim 32 further comprising:

coupling sense amplifiers to each bank to read memory cells; and coupling data path circuits to each bank to transfer data to and from the banks, wherein the banks can perform concurrent operations.

34. The method of claim 32 further comprising:

programming a chip controller circuit to direct address requests to selected memory cells in a desired bank.

35. The method of claim 32 wherein programming the chip controller further comprises:

coupling straps of the second metal layer to the chip controller circuit to set boundary addresses.

36. A method of forming a flash memory device comprising:

forming word lines in a poly silicon layer, wherein the word lines are coupled to gates of memory cells arranged in columns in a memory array;

forming local bit lines in a first metal layer, wherein the local bit lines are coupled to drains of memory cells arranged in rows in the memory array;

forming global bit lines in a second metal layer, wherein the global bit lines are selectively coupled to the local bit lines; and bisecting the global bit lines at predetermined locations to form a first and second bank in the memory array, wherein concurrent memory operations can be performed on the first and second banks.

37. The method of claim 36 further comprising:

programming control circuitry to recognize the boundaries of the first and second banks.

38. The method of claim 36 further comprising:

dividing each bank into a pair of quadrants.

39. The method of claim 38 further comprising:

coupling a row decoder circuit between the pair of quadrants to decode row addresses of rows in an associated bank.

40. The method of claim 38 further comprising:

coupling a sense amplifier circuit to local bit lines in each quadrant to read the memory cells in each quadrant.

41. The method of claim 38 wherein the location of the bisection of the global bit lines determines the size of the quadrants in the first and second banks.

42. The method of claim 38 further comprising:

coupling a data path circuit to each quadrant to provide a transition path to and from the memory cells in each quadrant.

43. The method of claim 42 wherein the global bit lines are in the data path circuit.

* * * * *